(12) United States Patent
Black et al.

(10) Patent No.: US 7,347,953 B2
(45) Date of Patent: Mar. 25, 2008

(54) METHODS FOR FORMING IMPROVED SELF-ASSEMBLED PATTERNS OF BLOCK COPOLYMERS

(75) Inventors: Charles T. Black, New York, NY (US); Ricardo Rulz, Yorktown Heights, NY (US); Robert L. Sandstrom, Chestnut Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/345,812

(22) Filed: Feb. 2, 2006

(65) Prior Publication Data

US 2007/0175859 A1 Aug. 2, 2007

(51) Int. Cl.
*B44C 1/22* (2006.01)
(52) U.S. Cl. ............................ 216/83; 216/37; 438/52; 438/106; 430/313; 430/315; 430/330; 430/558; 430/945
(58) Field of Classification Search ................... 216/83; 438/52; 430/315
See application file for complete search history.

(56) References Cited

U.S. PATENT DOCUMENTS

| 6,746,825 B2 * | 6/2004 | Nealey et al. ............... 430/315 |
| 7,037,744 B2 * | 5/2006 | Colburn et al. ............... 438/52 |
| 2004/0054127 A1 * | 3/2004 | Jin .............................. 528/422 |

OTHER PUBLICATIONS

Feijoo, Journal of Materials Science, vol. 5, (1986) pp. 313-314.*

C. T. Black "Integration Of Self Assembly For Semiconductor Microelectronics," IEEE 2005 Custom Integrated Circuits Conference, pp. 87-91 (2005).

R. A. Segalman, A. Hexemer, and E. J. Kramer, "Effects of Lateral Confinement on Order in Spherical Domain Block Copolymer Thin Films," *Macromolecules*, vol. 36, pp. 6831-6839, 2003.

R. A. Segalman, K. E. Schaefer, G. H. Fredrickson, E. J. Kramer, and S. Magonov, "Topographic Templating of Islands and Holes in Highly Asymmetric Block Copolymer Films," *Macromolecules*, vol. 36, pp. 4498-4506, 2003.

(Continued)

*Primary Examiner*—Duy-Vu N. Deo
*Assistant Examiner*—Maki Angadi
(74) *Attorney, Agent, or Firm*—Scully, Scott, Murphy & Presser, PC; Ido Tuchman, Esq.

(57) ABSTRACT

A method for forming self-assembled patterns on a substrate surface is provided. First, a block copolymer layer, which comprises a block copolymer having two or more immiscible polymeric block components, is applied onto a substrate that comprises a substrate surface with a trench therein. The trench specifically includes at least one narrow region flanked by two wide regions, and wherein the trench has a width variation of more than 50%. Annealing is subsequently carried out to effectuate phase separation between the two or more immiscible polymeric block components in the block copolymer layer, thereby forming periodic patterns that are defined by repeating structural units. Specifically, the periodic patterns at the narrow region of the trench are aligned in a predetermined direction and are essentially free of defects. Block copolymer films formed by the above-described method as well as semiconductor structures comprising such block copolymer films are also described.

19 Claims, 8 Drawing Sheets

OTHER PUBLICATIONS

R. A. Segalman, H. Yokoyama, and E. J. Kramer, "Graphoepitaxy of Spherical Domain Block Copolymer Films," *Advanced Materials*, vol. 13, pp. 1152-1155, 2001.

J. Y. Cheng, C. A. Ross, E. L. Thomas, H. I. Smith, and G. J. Vancso, "Fabrication of Nanostructures with Long-Range Order Using Block Copolymer Lithography," *Applied Physics Letters*, vol. 81, pp. 3657-3659, 2002.

J. Y. Cheng, C. A. Ross, E. L. Thomas, H. I. Smith, and G. J. Vancso, "Templated Self-Assembly of Block Copolymers: Effect of Substrate Topography," *Advanced Materials*, vol. 15, pp. 1599-1602, 2003.

C. T. Black and O. Bezenzenet, "Nanometer-Scale Pattern Registration and Alignment by Directed Diblock Copolymer Self-Assembly," *IEEE Transactions On Nanotechnology*, vol. 3, pp. 412-415, 2004.

X. Shuaigang, Y. XiaoMin, E. W. Edwards, L. Young-Hye, and P. F. Nealey, "Graphoepitaxy of Cylinder-Forming Block Copolymers for Use as Templates to Pattern Magnetic Metal Dot Arrays," *Nanotechnology*, vol. 16, pp. S324-S329, 2005.

D. Sundrani, S. B. Darling, and S. J. Sibener, "Hierarchical assembly and compliance of aligned nanoscale polymer cylinders in confinement," *Langmuir*, vol. 20, pp. 5091-5099, 2004.

D. Sundrani, S. B. Darling, and S. J. Sibener, "Guiding Polymers to Perfection: Macroscopic Alignment of Nanoscale Domains," *Nano Letters*, vol. 4, pp. 273-276, 2004.

Matthew R. Hammond, Eric Cochran, Glenn H. Fredrickson, and Edward J. Kramer, "Temperature Dependence of Order, Disorder, and Defects in Laterally Confined Diblock Copolymer Cylinder Monolayers," *Macromolecules* 38, 6575-6585, 2005.

F. S. Bates and G. H. Fredrickson, "Block Copolymer Thermodynamics: Theory and Experiment," *Annual Review of Physical Chemistry* 41, 525, 1990.

A. N. Semenov, "Contribution to the Theory of Microphase Layering in Block-Copolymer Melts," *Soviet Physics JETP* 61, 733, 1985.

P. F. Green et al., "Surface Interaction in Solvent-Cast Polystyrene/Poly (methylmethacrylate) Diblock Copolymers," *American Chemical Society, Macromolecules* 22, 2189, 1989.

A. W. Adamson and A. P. Gast, *Physical Chemistry of Surfaces* (Wiley, New York, 1997) p. 365.

J. T. Davies and E. K. Rideal, *Interfacial Phenomena* (Academic Press, New York, 1963) p. 34-39.

Massachusetts Institute of Technology, *Hatsopoulos Microfluids Laboratory*, http://web.mit.edu/agrawala/www/NIRT/ca.html; [Not Available].

T. P. Russell, R. P. Hjelm_Jr., and P. A. Seeger, "Temperature Dependence of the Interaction Parameter of Polystyrene and Poly(methyl methacrylate)," *American Chemical Society, Macromolecules* 23, 890, 1990.

Watson Loh, "Block Copolymers Micelles," *Encyclopedia of Surface and Colloid Science* 802-813, 2002; and.

Joy Y. Cheng, Anne M. Mayes and Caroline A. Ross, "Nanostructure Engineering by Templated Self-Assembly of Block Copolymers,"*Nat. Mat.* 3 823-828, 2004.

\* cited by examiner

METHODS FOR FORMING IMPROVED SELF-ASSEMBLED PATTERNS OF BLOCK COPOLYMERS

FIELD OF THE INVENTION

The present invention generally relates to the self-assembly of block copolymer materials into periodic patterns (i.e., patterns defined by repeating structural units) on a particular surface. More particularly, the present invention provides a method that employs substrate structures of improved surface geometry for enhancing alignment of the self-assembled periodic patterns of a block copolymer along a predetermined direction as well as for reducing defects in the self-assembled periodic patterns. The present invention also relates to a semiconductor structure that comprises a block copolymer layer having improved periodic patterns, as well as to the block copolymer layer itself.

BACKGROUND OF THE INVENTION

Self-assembly of materials can be defined as the spontaneous organization of materials into ordered patterns without the need for human interference. Examples of material self-assembly range from snowflakes to seashells to sand dunes, all of which form some type of regular or ordered patterns in response to the external conditions.

Among various self-assembling materials, self-assembling block copolymers have attracted attention. Each self-assembling block copolymer typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Such ordered patterns of isolated nano-sized structural units formed by the self-assembling block copolymers may potentially be used for fabricating periodic nano-scale structural units and therefore have promising applications in semiconductor, optical, and magnetic devices. Specifically, dimensions of the structural units so formed are typically in the range of 10 nm, which are extremely difficult to define using the conventional lithographic techniques. Further, the block copolymers are compatible with conventional semiconductor, optical, and magnetic processes, and structural units formed by the block copolymers can therefore be readily integrated into semiconductor, optical, and magnetic devices.

Most potential applications of the self-assembled block copolymer patterns require such patterns to be aligned in a predetermined direction and to be essentially free of defects. There is therefore a continuing need for improving the alignment of the self-assembled patterns of block copolymers and for reducing defects in such patterns.

SUMMARY OF THE INVENTION

The present invention employs substrate structures of improved surface geometry for enhancing alignment of the self-assembled periodic patterns of a block copolymer along a predetermined direction as well as for reducing defects in the self-assembled periodic patterns.

In one aspect, the present invention relates to a method of forming periodic patterns on a substrate surface, comprising:
  applying a layer of a block copolymer that comprises two or more different polymeric block components that are immiscible with one another over a substrate that comprises a substrate surface with a trench therein, wherein the trench includes at least one narrow region flanked by two wide regions, and wherein the trench has a width variation of more than 50%; and
  annealing the block copolymer layer to form periodic patterns inside the trench, wherein the periodic pattern is defined by repeating structural units, and wherein the periodic patterns at the narrow region of the trench are aligned in a predetermined direction and are essentially free of defects.

Another aspect of the present invention relates to a semiconductor structure, which comprises:
  a substrate having a substrate surface with a trench therein, wherein the trench includes at least one narrow region flanked by two wide regions, and wherein the trench has a width variation of more than 50%; and
  a block copolymer layer located in the trench on a surface of a substrate, wherein the block copolymer layer comprises periodic patterns defined by repeating structural units, and wherein the periodic patterns at the narrow region of the trench are aligned in a predetermined direction and are essentially free of defects.

A further aspect of the present invention relates to a block copolymer layer having periodic patterns defined by repeating structural units, wherein the block copolymer layer includes at least one narrow region flanked by two wide regions with a width variation of more than 50% therebetween, and wherein the periodic patterns at the narrow region are aligned in a predetermined direction and are essentially free of defects.

Other aspects, features and advantages of the invention will be more fully apparent from the ensuing disclosure and appended claims.

DETAILED DESCRIPTION OF THE INVENTION AND PREFERRED EMBODIMENTS

Figure 1:
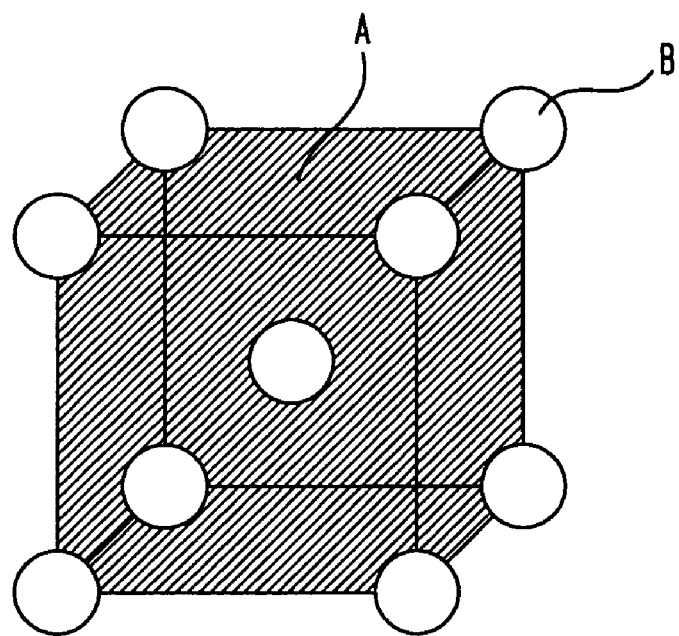
FIG. 1 shows a pattern that is formed by a block copolymer with polymeric block components A and B, while the pattern comprises an ordered array of spheres composed of the polymeric block component B in a matrix composed of the polymeric block component A.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "width variation" as used herein refers to the variation of width in different regions of a structure, which is calculated as $(W_L - W_S)/W_L$, wherein $W_L$ is the width measured at the widest region of the structure, and wherein $W_S$ is the width measured at the narrowest region of the structure.

The term "annealing" or "anneal" as used herein refers to treatment of the block copolymer so as to allow sufficient phase separation between the two or more different polymeric block components of the block copolymer in forming an ordered pattern defined by repeating structural units. Annealing of the block copolymer in the present invention can be achieved by various methods known in the art, including, but not limited to: thermal annealing (either in a vacuum or in an inert atmosphere containing nitrogen or argon), solvent vapor-assisted annealing (either at or above room temperature), or supercritical fluid-assisted annealing. As a specific example, thermal annealing of the block copolymer can be conducted at an elevated temperature that is above the glass transistor temperature ($T_g$) but below the degradation temperature ($T_d$) of the block copolymer, as described in greater detail hereinafter. Other well-known annealing methods will not be been described in detail, in order to avoid obscuring the invention.

The term "defect" or "defects" as used herein refers to any perturbation in the translational or orientational order of a pattern. For example, when the pattern is defined by alternating lamellae, all the lamellae in such a pattern must be aligned along the same direction in order for the pattern to be considered defect-free. Defects in the lamellar patterns can have various forms, including dislocation (i.e., line defects arising from perturbations in the translational order), disclination (i.e., line defects arising from perturbations in the orientational order), spiral-shaped defects, or target-shaped defects.

The term "essentially free of defects" as used herein defines a defect density of less than about 1 defect per $\mu m^2$.

The present invention employs substrate structures of improved surface geometry to enhance alignment of the self-assembled periodic patterns of block copolymers along predetermined directions. Specifically, the substrate structures of the present invention each comprises on its surface a trench of significant width variation, i.e., the trench comprises at least one relatively narrow region that is flanked by two relatively wide regions, and the width of the trench at the narrow region is significantly smaller than the width at the wide regions. Preferably, but not necessarily, the width variation between the narrow region of the trench and the wide regions of the trench is more than 50%, i.e., the width at the wide regions of the trench is more than twice larger than that at the narrow region.

It has been discovered by the inventors of the present invention that such an improved substrate with a trench of significant width variation functions to facilitate alignment of the self-assembled periodic patterns of block copolymers at the narrow region of the trench. The self-assembled periodic patterns of block copolymers align almost perfectly along the longitudinal axis of the trench at the narrow region of the trench.

Further, the wide regions that flank the narrow region of the trench function as "defect sinks" that facilitate diffusion of defects away from the narrow region as well as annihilation of the defects. Consequently, the presence of a defect in the narrow region of the trench becomes energetically less favorable, and therefore the self-assembled periodic patterns of block copolymers formed at the narrow region of the trench are essentially free of defects.

There are many different types of block copolymers that can be used for forming the self-assembled periodic patterns. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of a first polymeric block component A and a second polymeric block component B that are immiscible with each other. More preferably, one of the components A and B is selectively removable without having to remove the other, so as to form either isolated and orderly arranged structural units composed of the un-removed component, or a continuous structural layer containing isolated and orderly arranged cavities formed after the removable component has been removed. Alternatively, the components A and B may simply have different electrical, optical, and/or magnetic properties, so that the ordered patterns composed of such components A and B can be used for fabricating different device structures.

The block copolymer used in the present invention may contain any numbers of the polymeric block components A and B arranged in any manner. The block copolymer can have a linear or branched structure. Preferably, such a block polymer is a linear diblock copolymer having the formula of A-B. Further, the block copolymer can have any one of the following formula:

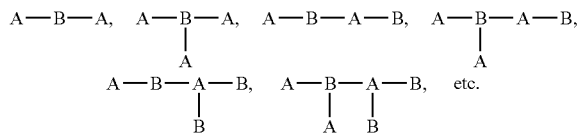

Specific examples of suitable block copolymers that can be used for forming the self-assembled periodic patterns of the present invention may include, but are not limited to: polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

The specific self-assembled periodic patterns formed by the block copolymer are readily determined by the molecular weight ratio between the first and second polymeric block components A and B.

Specifically, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A, as shown in FIG. 1.

Figure 2:
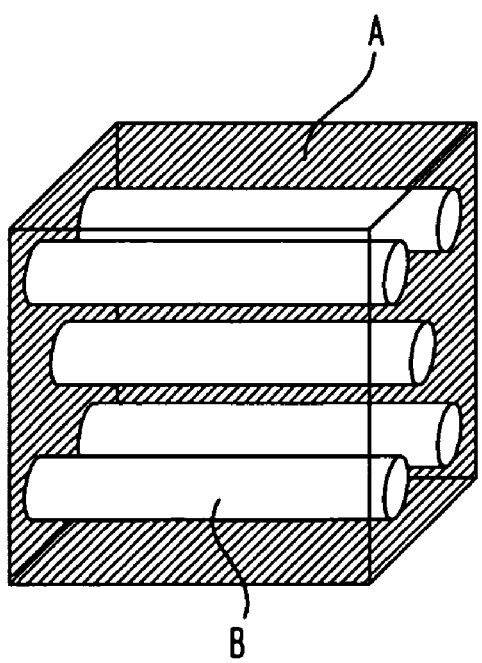
FIG. 2 shows a pattern that is formed by a block copolymer with polymeric block components A and B, while the pattern comprises an ordered array of cylinders composed of the polymeric block component B in a matrix composed of the polymeric block component A.

When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A, as shown in FIG. 2.

Figure 3:
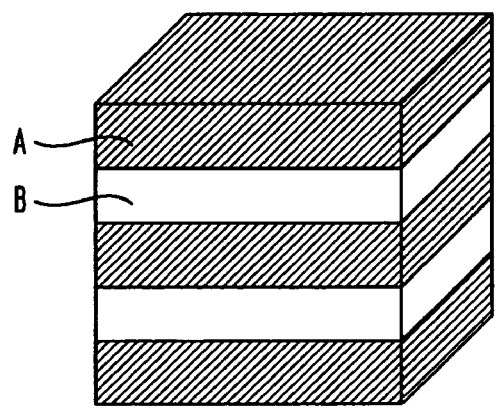
FIG. 3 shows a pattern that is formed by a block copolymer with polymeric block components A and B, while the pattern comprises alternating lamellae composed of the polymeric block components A and B.

When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B, as shown in FIG. 3.

Figure 4:
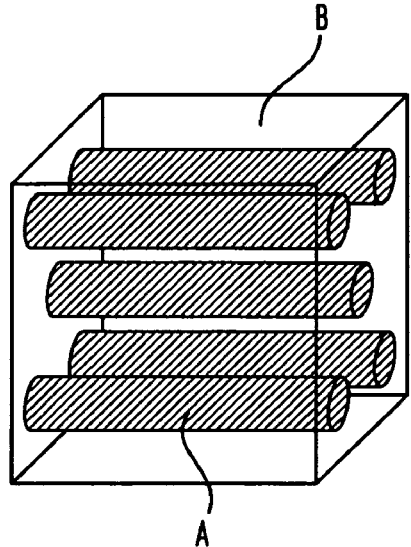
FIG. 4 shows a pattern that is formed by a block copolymer with polymeric block components A and B, while the pattern comprises an ordered array of cylinders composed of the polymeric block component A in a matrix composed of the polymeric block component B.

When the ratio of the molecular weight of the first polymeric block component A over the molecular weight of the second polymeric block component B is less than about 40:60 but greater than about 20:80, the block copolymer will form an ordered array of cylinders composed of the first polymeric block component A in a matrix composed of the second polymeric block component B, as shown in FIG. 4.

Figure 5:
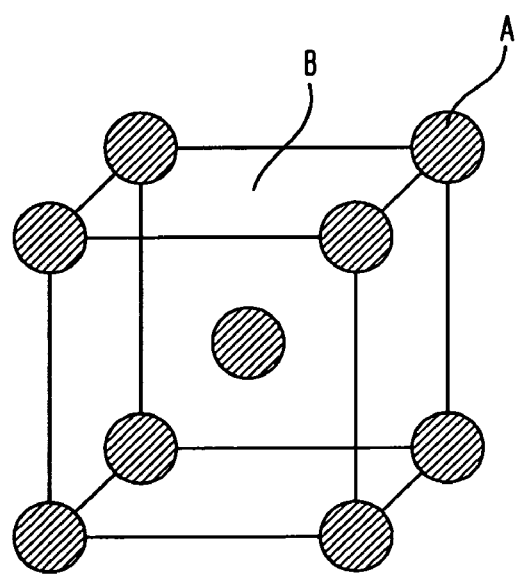
FIG. 5 shows a pattern that is formed by a block copolymer with polymeric block components A and B, while the pattern comprises an ordered array of spheres composed of the polymeric block component A in a matrix composed of the polymeric block component B.

When the ratio of the molecular weight of the first polymeric block component A over the molecular weight of the second polymeric block component B is less than about 20:80, the block copolymer will form an ordered array of spheres composed of the first polymeric block component A in a matrix composed of the second polymeric block component B, as shown in FIG. 5.

Therefore, the molecular weight ratio between the first and second polymeric block components A and B can be readily adjusted in the block copolymer of the present invention, in order to form desired self-assembled periodic patterns.

In a particularly preferred embodiment of the present invention, the block copolymer used for forming the self-assembled periodic patterns of the present invention is PS-b-PMMA. PS and the PMMA blocks in such a PS-b-PMMA block copolymer can each have a molecular weight ranging from about 10 kg/mol to about 100 kg/mol, with a molecular weight from about 20 kg/mol to about 50 kg/mole being more typical.

The surface energies of PS and PMMA have been reported to be $\gamma_{PS}=40.7$ dyn/cm and $\gamma_{PMMA}=41.1$ dyn/cm at 20° C. respectively. Water contact angles for polystyrene range around 84-91°, whereas for PMMA they are around 75°.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N>10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473K (≈200° C.). When the molecular weight ($M_n$) of the PS-b-PMMA diblock copolymer is approximately 51 Kg/mol, with a molecular weight ratio (PS:PMMA) of approximately 50:50, the degree of polymerization N is about 499.7, so $\chi N$ is approximately 18.1 at 200° C. Alternatively, when $M_n$ of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

Therefore, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns, which comprise repeating structural units (i.e., spheres, cylinders, or lamellae) composed of different block components, as described hereinabove.

The periodicity or the dimension ($L_0$) of the repeating structural units in the periodic pattern is determined by intrinsic polymeric properties such as the degree of polymerization N and the Flory-Huggins interaction parameter $\chi$. At the strong segregation limit, $L_0 \sim N^{2/3}\chi^{1/6}$. In other words, $L_0$ scales with the degree of polymerization N, which in turn correlates with the molecular weight $M_n$ and the molecular weight ratio between different polymeric block components. Therefore, by adjusting the composition and the total molecular weight of the block copolymer of the present invention, the dimensions of the repeating structural units can be readily tuned.

In order to form the self-assembled periodic patterns, the block copolymer is first dissolved in a suitable solvent system to form a block copolymer solution, which is then applied onto the substrate surface to form a thin block-copolymer layer, followed by annealing of the thin block-copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the substrate surface by any suitable techniques, including, but not limited to: spin casting, coating, spraying, ink coating, dip coating, etc. Preferably, the block copolymer solution is spin cast onto the substrate surface to form a thin block copolymer layer.

After application of the thin block copolymer layer onto the substrate surface, the entire substrate is annealed to effectuate micro-phase segregation of the different block components contained by the block copolymer, thereby forming the periodic patterns with repeating structural units.

As mentioned hereinabove, annealing of the block copolymer in the present invention can be achieved by various methods known in the art, including, but not limited to: thermal annealing (either in a vacuum or in an inert atmosphere containing nitrogen or argon), solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours.

Figure 6:
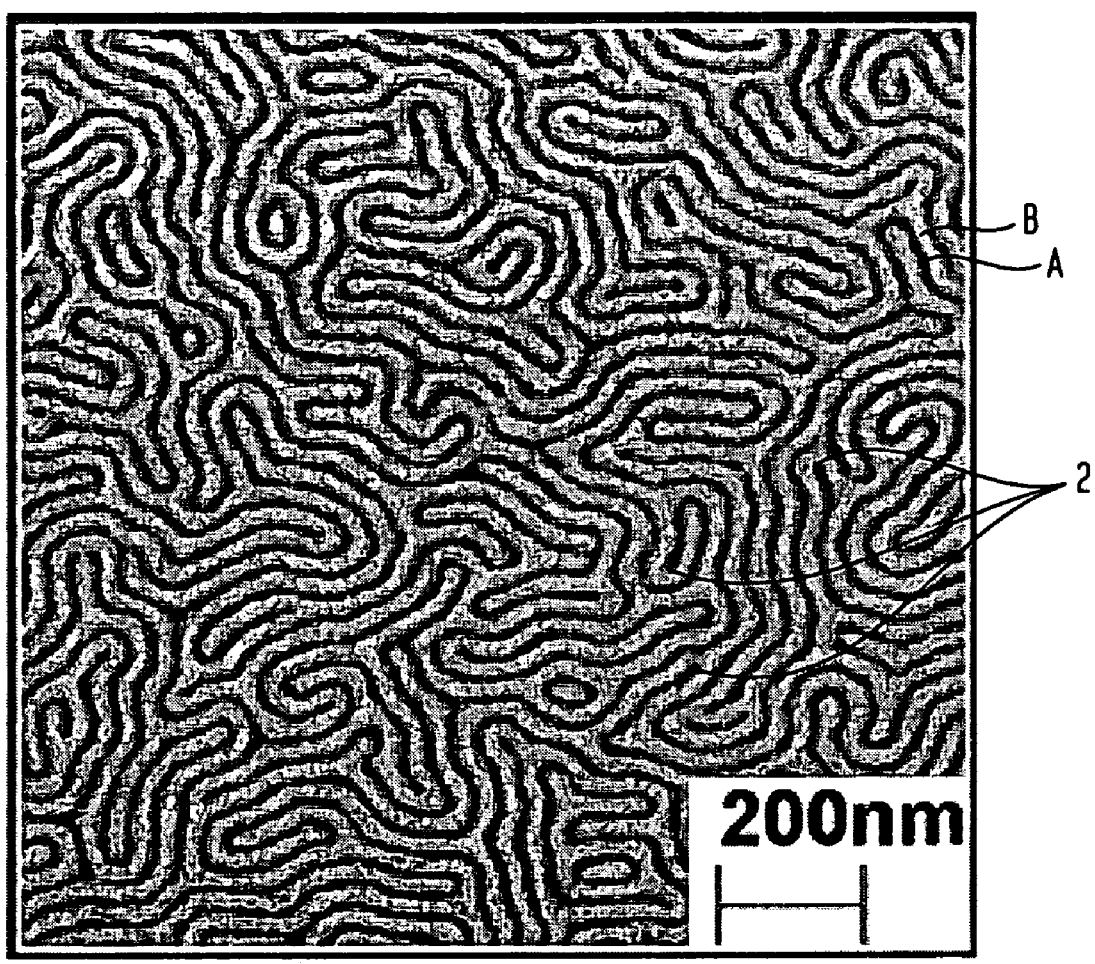
FIG. 6 is a top-down scanning electron microscopic (SEM) photograph of a block copolymer thin film, where the thin film contains periodic patterns defined by randomly oriented alternating lamellae with substantial defects.

FIG. 6 shows a top-down scanning electron microscopic (SEM) photograph of a block copolymer thin film, which is formed over a substantially planar substrate surface. The thin film contains periodic patterns defined by randomly oriented alternating lamellae composed of the first and second polymeric block components A and B. The thickness of each A or B lamellae (i.e., $0.5 L_0$) is approximately 15 nm. The thin film contains a substantial number of randomly appearing or disappearing lamellae 2, which are undesirable defects.

As mentioned hereinabove, most applications of the self-assembly block copolymer films require the periodic patterns to be aligned in a predetermined direction, with little or no defects. In order to achieve better alignment of the periodic patterns and reduce the defects contained therein, the present invention provides improved substrate structures with novel surface geometry, i.e., surface trenches with significant width variation, in which the improved periodic patterns can be formed.

Figure 7A:
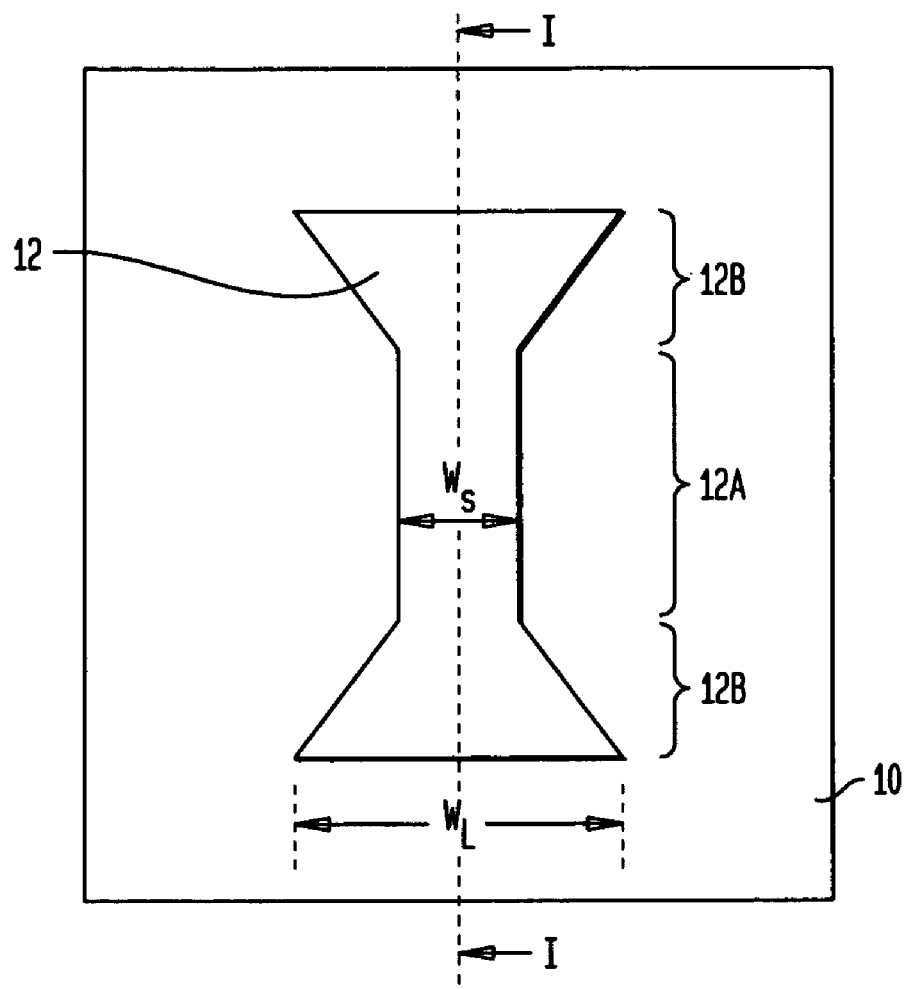
FIG. 7A shows a top-view of an exemplary substrate that contains a trench with more than 50% width variation, according to one embodiment of the present invention.

FIG. 7A shows a top-view of an exemplary substrate 10 that contains a surface trench 12, according to one embodiment of the present invention. The surface trench 12 can be either closed ended (as shown in FIG. 7A) or open-ended (not shown), as long as such trench 12 contains at least one relatively narrow region 12A that is flanked by two relatively wide regions 12B.

The width of the trench 12 at the narrow region 12A is referred to herein as $W_S$, and the width of the trench 12 at the wide regions 12B is referred to herein as $W_L$. It is preferred that the width variation of the trench, which is calculated as $(W_L - W_S)/W_L$, is more than 50% width variation. In other words, $W_L$ is more than twice larger than $W_S$.

Such a surface trench 12 with more than 50% width variation is particularly efficient in facilitating the alignment of the periodic patterns during self-assembling of a block copolymer film (not shown). Specifically, the periodic patterns of the block copolymer film (not shown) formed in such a surface trench 12 align almost perfectly along the longitudinal axis of the trench at the narrow region 12A. Further, the wide regions 12B of the trench 12 function as "defect sinks" to facilitate diffusion of defects away from the narrow region 12A as well as annihilation of the defects. Consequently, the presence of a defect in the narrow region 12A of the trench 12 becomes energetically less favorable, and therefore the self-assembled periodic patterns of the block copolymer film (not shown) are essentially free of defects at the narrow region 12A of the trench 12.

Figure 7B:
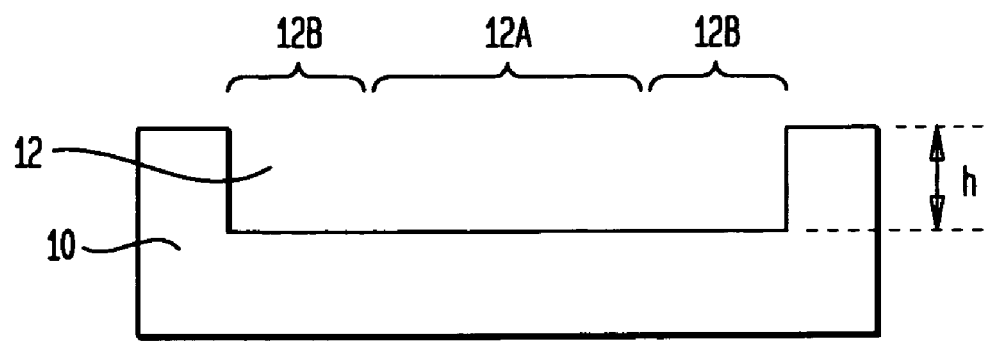
FIG. 7B shows a cross-sectional view of the substrate in FIG. 7A along the I-I line.

FIG. 7B shows a cross-sectional view of the substrate 10 in FIG. 7A along the I-I line. It is preferred that the depth (h) of the trench 12 is substantially uniform throughout the narrow region 12A and the wide regions 12B.

Figure 8:
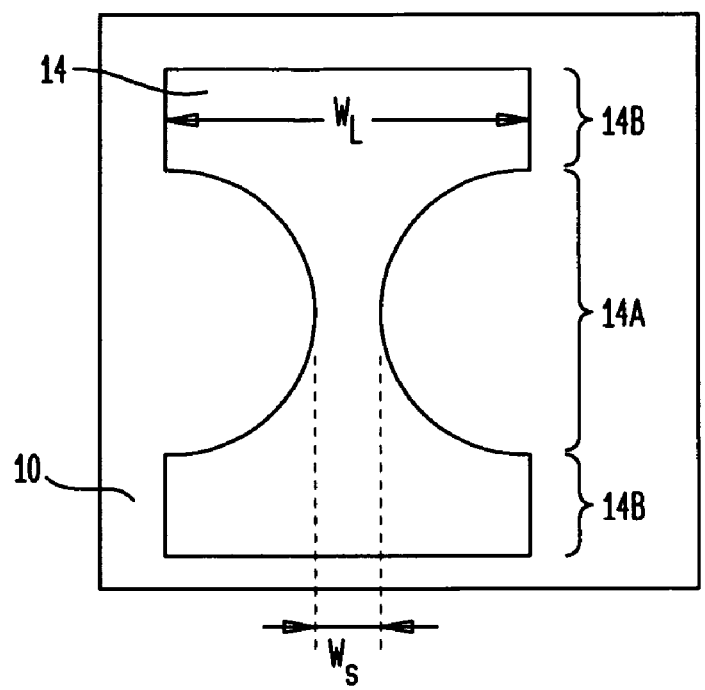
FIGS. 8-10 show top-views of several exemplary substrates that each contains a trench with more than 50% width variation, according to specific embodiments of the present invention.
Figure 9:
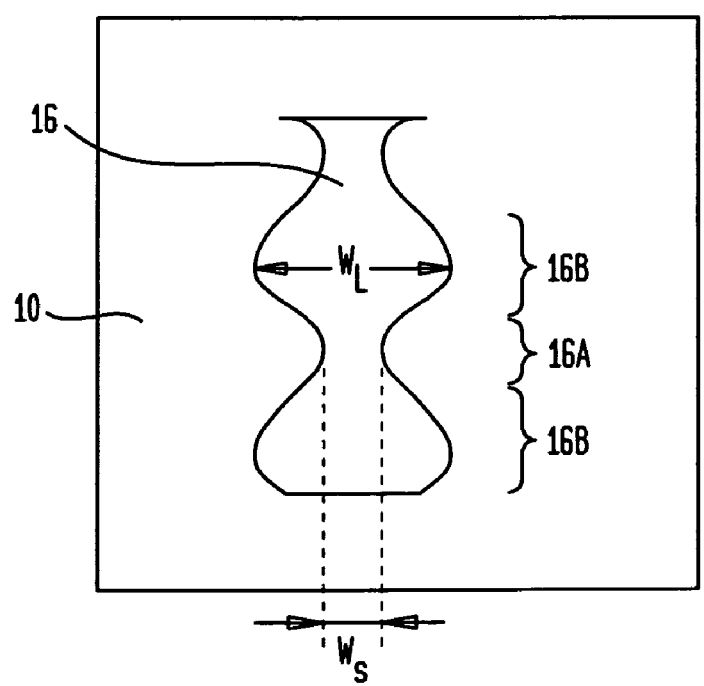
Figure 10:
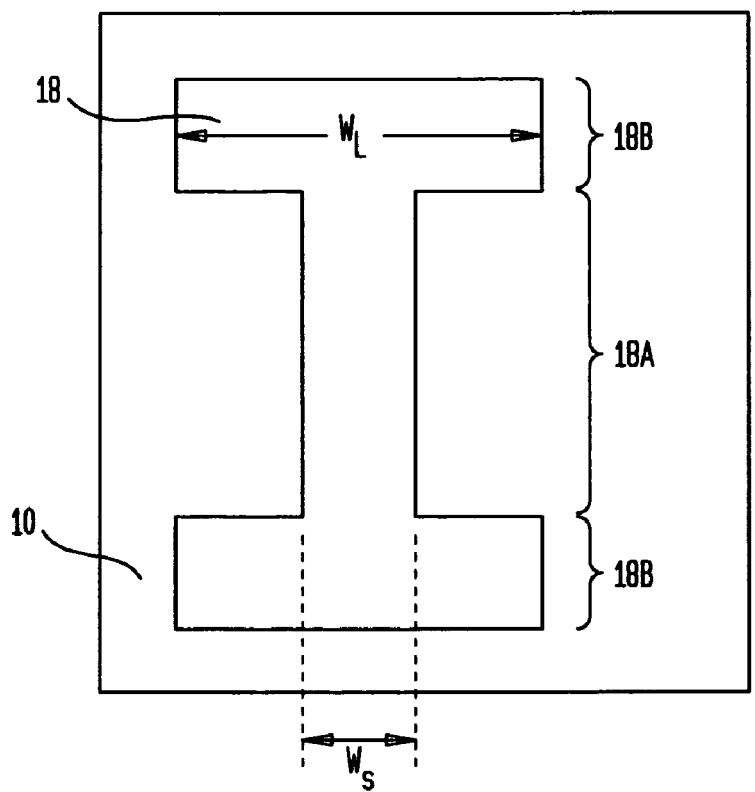

Various surface trench geometries can be used for practice of the present invention, as long as such trenches have sufficient width variations. For example, FIG. 8 shows a top view of another surface trench 14 (which can be either close-ended or open-ended) of a slightly different shape, while trench 14 also contains at least one relatively narrow region 14A that is flanked by two relatively wide regions 14B, while the trench width ($W_S$) at the narrow region 14A is less than half of trench width ($W_L$) at the wide region 14B. FIG. 9 shows a top view of yet another surface trench 16 (which can be either close-ended or open-ended) of another shape, while trench 16 likewise contains at least one relatively narrow region 16A that is flanked by two relatively wide regions 16B, where the trench width ($W_S$) at the narrow region 16A is less than half of trench width ($W_L$) at the wide region 16B. FIG. 10 shows a top view of still another surface trench 18 (which can be either close-ended or open-ended) of a further different shape, while trench 18 also contains at least one relatively narrow region 18A that is flanked by two relatively wide regions 18B, while the trench width ($W_S$) at the narrow region 18A is less than half of trench width ($W_L$) at the wide region 18B.

Preferably, but not necessarily, the trench width ($W_S$) at the narrow region of the above-described surface trenches ranges from about $1.5 L_0$ to about $20.5 L_0$, more preferably from about $1.5 L_0$ to about $10.5 L_0$. The trench depth (h)

preferably ranges from about 0.25 $L_0$ to about 3 $L_0$, and more preferably from about 0.5 $L_0$ to about 1 $L_0$. Note that typical periodicity of the block copolymer repeating structural units ranges from about 5 nm to about 100 nm, and more typically from about 10 nm to about 50 nm. Still more typically, the periodicity ranges from about 15 nm to about 50 nm.

As a specific example of the present invention, a lamellae-forming PS-b-PMMA block copolymer having a molecular weight of about 51 kg/mole is used for forming the self-assembled periodic patterns. Since $L_0$ is approximately 30 nm for such a lamellae-forming PS-b-PMMA block copolymer, the preferred trench width ($W_S$) at the narrow region of the trench ranges from about 45 nm to about 615 nm, and more preferably from about 45 nm to about 315 nm, while the preferred trench depth (h) ranges from about 7.5 nm to about 90 nm, and more preferably from about 15 nm to about 30 nm.

In order to form the self-assembled periodic patterns, the thickness of the applied block copolymer layer needs to reach a critical value $L_0$. If the block copolymer layer is thinner than $L_0$, the repeating structural units cannot be formed. On the other hand, if such a block copolymer layer has a thickness that is a multiplicity of $L_0$, then multiple layers of repeating structural units will be formed.

In a particularly preferred embodiment of the present invention, it is preferred to form a block copolymer film with a portion inside the trench and a portion outside the trench, while the portion inside the trench has a sufficient thickness ($L_0$) for self-assembling into a single layer of repeating structural units (i.e., similar to a monolayer) inside the trench, while the portion outside the trench does not have sufficient thickness for self-assembling and therefore remains amorphous or featureless, i.e., without any repeating structural units. In order to achieve such a block copolymer film, the trench depth (h) preferably ranges from about 0.5 $L_0$ to about 1 $L_0$, so that application of a block copolymer layer of more than 0.5 $L_0$ thick but less than about 1 $L_0$ thick will provide sufficient layer thickness in the trench for self-assembling of the block copolymer into a monolayer of repeating structural units, but not outside the trench. In other words, the overall film thickness of the block copolymer layer is less than 1 $L_0$, so it is not sufficient to form self-assembled repeating structural units at most regions on the substrate surface. However, the surface trench collects extra block copolymer material to reach the critical thickness of 1 $L_0$, thereby enabling self-assembling of the block copolymer material into repeating structural units inside the trench and only inside the trench.

In order to maintain the defect-free characteristics of the periodic patterns in the narrow region of the trench, it is preferred that the length of the narrow region is not more than about 2 microns at a given width ($W_S$) of about 1.5-2.5 $L_0$. When the trench width ($W_S$) at the narrow region increase to about 2.5-4.5 $L_0$, the length of the narrow region should not be more than about 0.6 micron, in order to reduce the risk of defect formation.

The surface trenches as described hereinabove can be readily formed by various well-known techniques. For example, conventional lithography and etching processes can be used to form a surface trench that has the desired geometry and a trench depth ranging from about 5 nm to about 100 nm, more typically of about 15-30 nm.

Upon application of the thin block copolymer layer over the substrate surface, followed by the annealing step, as described hereinabove, the block copolymer self-assembles into periodic patterns that are self-aligned to the longitudinal axis of the surface trench at the narrow region, with little or no defects thereat.

The present invention is applicable to both symmetric (i.e., having substantially the same amount of blocks A and B) and non-symmetric (i.e., having significantly different amounts of blocks A and B) block copolymers. However, since the symmetric and non-symmetric block copolymers tend to form different periodic patterns (i.e., symmetric block copolymers form alternating lamellae, while non-symmetric block copolymers form order arrays of either spheres or cylinders), the trench surface of the present invention has to be prepared differently in order to form the desired wetting properties for aligning different periodic patterns.

The wetting properties as discussed herein refer to the surface affinities of a specific surface with respect to the different block components of the block copolymers. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

Surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

For lamellae-forming symmetric block copolymers, it is desired to arrange the alternating lamellae so formed in perpendicular to a bottom surface of the trench. Therefore, it is desirable to provide a trench with a neutral or non-preferential bottom surface but preferential sidewall surfaces.

Figure 11:
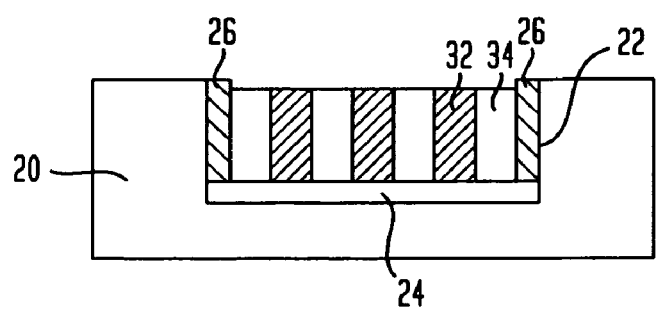
FIG. 11 shows a cross-sectional view of a substrate having a trench with vertically arranged alternating lamellae structures therein, according to one embodiment of the present invention.

FIG. 11 shows a cross-sectional view of a substrate 20 having a surface trench 22 defined by a bottom surface and sidewall surfaces. The bottom surface is preferably coated with a neutral or non-preferential material 24 and therefore forms a neutral or non-preferential surface, while the sidewall surfaces are preferably coated with a preferential material 26 and therefore form preferential surfaces. The preferential material 26 for example has preferential affinity for one of, but not the other of, the block components A and B contained in the block copolymer.

In this manner, a block copolymer film containing alternating lamellae structures 32 and 34 formed of block components A and B can be formed in such a surface trench 22. The bottom surface of the trench is wettable by both components A and B, while the sidewall surfaces are only wettable by one of, but not the other of, block components A and B. Therefore, the alternating lamellae structures 32 and 34 are vertically arranged, i.e., perpendicular to the bottom surface of the trench 22.

For cylinder-forming non-symmetric block copolymers, it is desired to arrange the cylinder arrays either parallel with, or perpendicular to, the bottom surface of the trench. For forming parallelly arranged cylinder arrays, it is desirable to provide a trench with a preferential bottom surface as well as preferential sidewall surfaces. In contrast, for forming perpendicularly arranged cylinder arrays, it is desirable to provide a trench with a neutral or non-preferential bottom surface but preferential sidewall surfaces.

Figure 12:
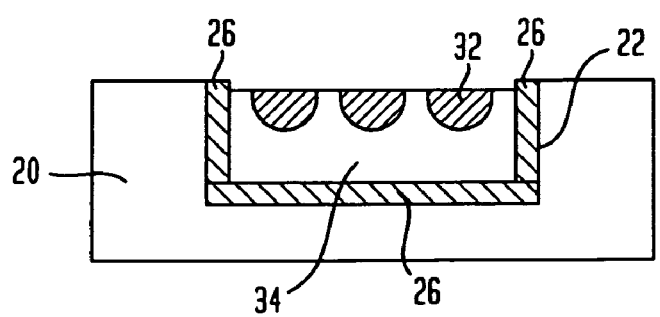
FIG. 12 shows a cross-sectional view of a substrate having a trench with an array of horizontally aligned cylindrical structures therein, according to one embodiment of the present invention.

FIG. 12 shows a cross-sectional view of a substrate 20 having a surface trench 22 defined by a bottom surface and sidewall surfaces, which are coated with a preferential material 26 and therefore form preferential surfaces that have surface affinity for one of, but not the other of, block components A and B of the block copolymer. In this manner, a block copolymer film containing a single layer of ordered cylinders 32 (formed of one of block components A and B) in a matrix 34 (formed of the other of block components A and B) can be formed in such a surface trench. The bottom and sidewall surfaces of the trench 22 are only wettable to one of, but not the other of, block components A and B. Therefore, the cylinders 32 are arranged horizontally, i.e., parallel to the bottom surface of the trench.

For sphere-forming non-symmetric block copolymers, the trench should have a preferential bottom surface as well as preferential sidewall surfaces.

As a specific example of the present invention, a block copolymer solution, which contained 0.5 wt % lamellae-forming symmetric PS-b-PMMA with a molecular weight of about 51 kg/mol in toluene, was spin cast at 2000-5000 revolutions per minute (rpm) onto various substrates containing surface trenches of different geometries. Each of the surface trenches had a width variation larger than 50%, and a trench depth of about 20 nm. The substrates were then annealed at about 250° C.-260° C. for about 10-12 hours, and the block copolymer films so formed are shown in FIGS. 13-15.

Figure 13:
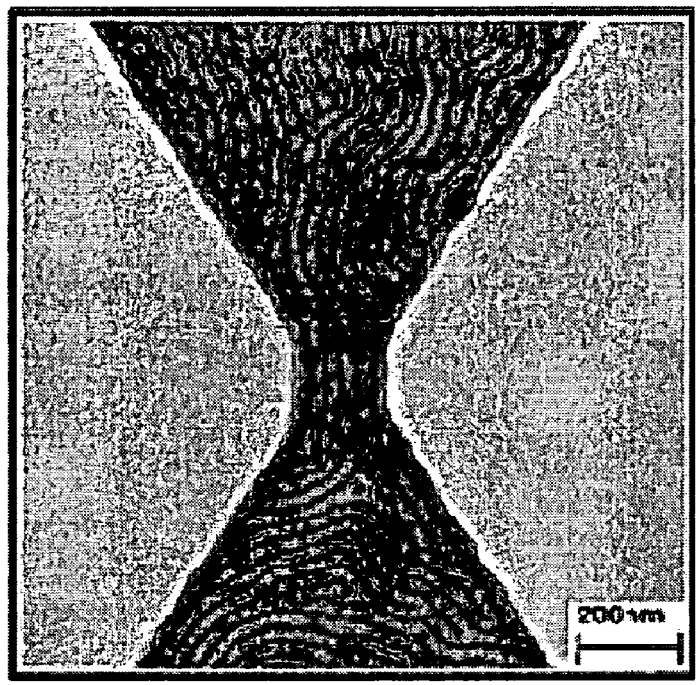
FIGS. 13-15 show top-down SEM photographs of block copolymer thin films formed in trenches on substrate surfaces, where the trenches each has more than 50% width variation, and the block copolymer thin films each comprises periodic patterns defined by alternating lamellae structures that are vertically arranged in the trenches, according to specific embodiments of the present invention.
Figure 14:
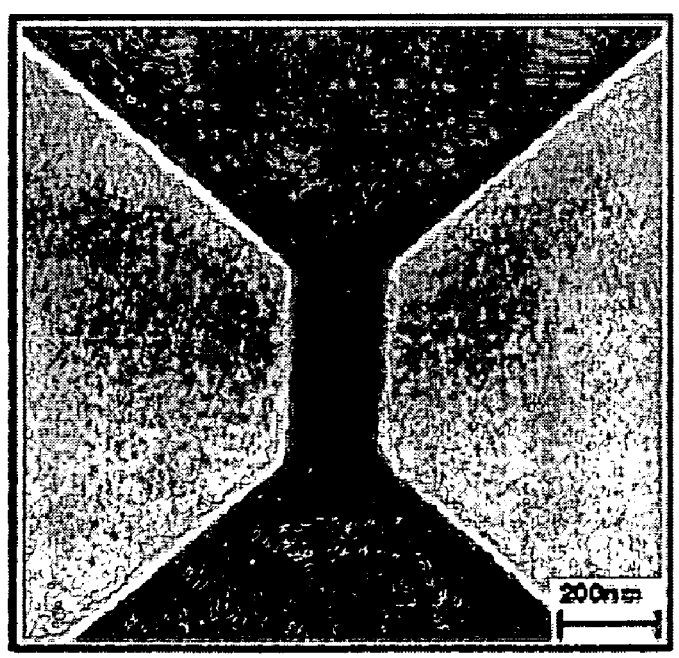
Figure 15:
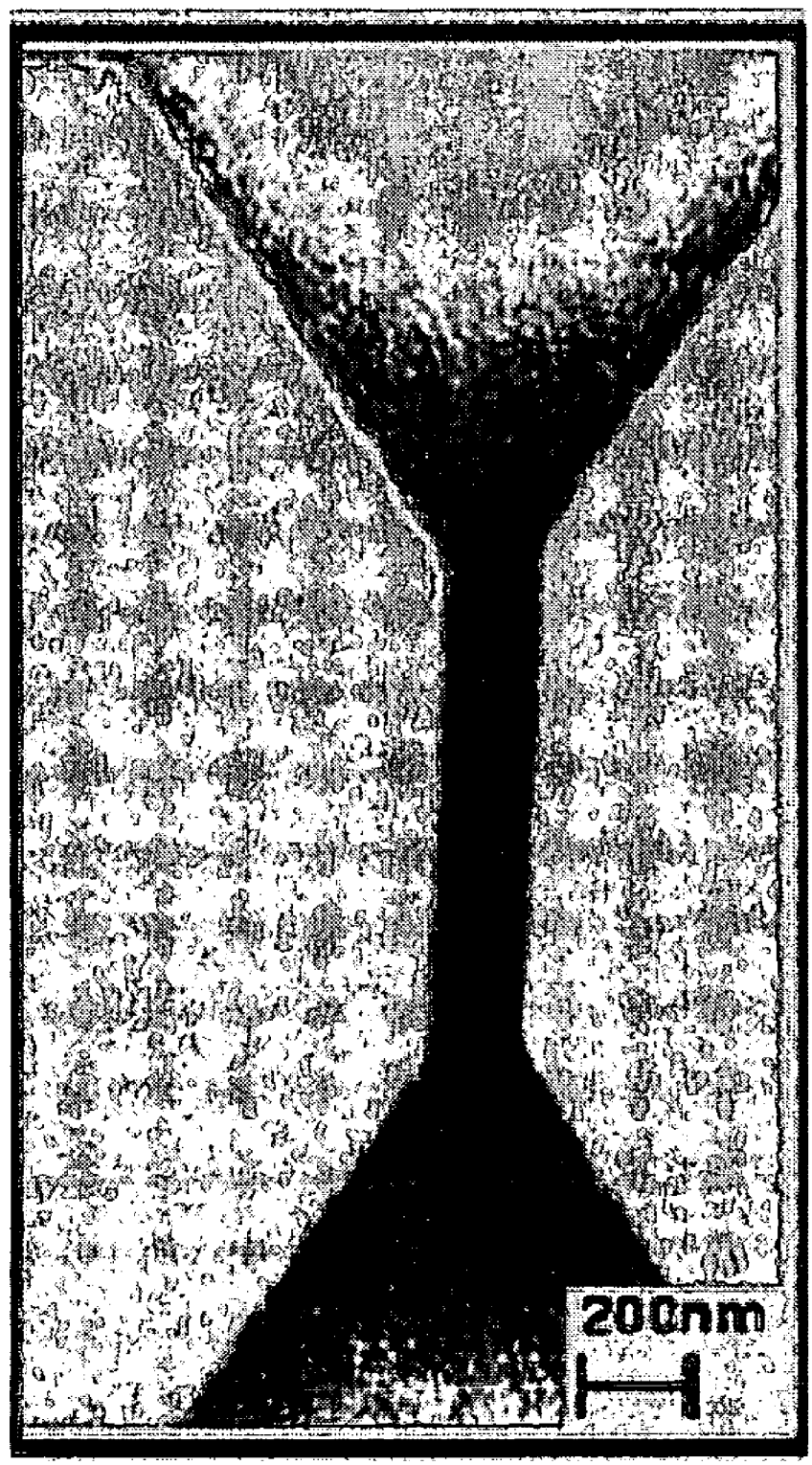

Specifically, FIGS. 13-15 are the SEM photographs of the resulting block copolymer films, each of which comprises alternating lamellae structures that are arranged perpendicular to the substrate surface. Note that the lamellae structures at the narrow regions of the trenches are almost perfectly aligned along the longitudinal axes of the trenches with no defects.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming patterns on a substrate surface, comprising:
applying a layer of a block copolymer that comprises two or more polymeric block components that are immiscible with one another over a substrate that comprises a substrate surface with a thrench therein, wherein the thrench includes at least one narrow region flanked by two wide regions, and wherein the trench has a width variation of more than 50%; and
annealing the block copolymer layer to form periodic patterns inside the trench, wherein the periodic patterns are defined by repealing structural units, and wherein the periodic patterns at the narrow region of the trench are aligned in a predetermined direction and are essentially free of defects.

2. The method of claim 1, wherein the block copolymer consists essentially of a first polymeric block component A and a second polymeric block component B that are immiscible with each other.

3. The method of claim 2, wherein one of the first and second polymeric block components A and B can be selectively removed without removing the other.

4. The method of claim 1, wherein the repeating structure units comprise lamellae.

5. The method of claim 4, wherein the lamellae have a periodicity ranging from about 5 nm to about 100 nm.

6. The method of claim 4, wherein the lamellae have a periodicity ranging from about 10 nm to about 50 nm.

7. The method of claim 2, wherein the first and second polymeric block components A and B have different electrical, optical, and/or magnetic properties.

8. The method of claim 1, wherein the block copolymer is selected from the group consisting of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

9. The method of claim 1, wherein the trench has a depth ranging from about 0.25 $L_0$ to about 3 $L_0$, wherein the at least one narrow region of the trench has a width that ranges from about 1.5 $L_0$ to about 20.5 $L_0$, and wherein $L_0$ is the periodicity of the repeating structural units in the periodic patterns.

10. The method of claim 1, wherein the width of the at least one narrow region of the thrench ranges from about 1.5 $L_0$ to about 2.5 $L_0$, wherein $L_0$ is the periodicity of the repeating structural units in the periodic patterns, and wherein the at least one narrow region of the trench has a length of not more than about 2 microns.

11. The method of claim 1, wherein the width of the at least one narrow region of the trench ranges from about 2.5 $L_0$ to about 4.5 $L_0$, wherein $L_0$ is the periodicity of the repeating structural units in the periodic patterns, and wherein the at least one narrow region of the trench has a length of not more than about 0.6 microns.

12. The method of claim 1, wherein thermal annealing is conducted to anneal the block copolymer layer, wherein the block copolymer has a glass transition temperature $T_g$ and a degradation temperature $T_d$, and wherein the thermal annealing is carried out at an elevated temperature that is above $T_g$ but below $T_d$ for a duration ranging from about 1 hour to about 100 hours.

13. The method of claim 2, wherein the molecular weight ratio of the first and second polymeric block components A and B ranges from about 40:60 to about 60:40, and wherein the repeating structural units in the periodic patterns comprise alternating lamellae composed of the first and second polymeric block components A and B arranged perpendicular to a bottom surface of the trench.

14. The method of claim 13, wherein the trench has preferential sidewall surfaces and a non-preferential bottom surface.

15. The method of claim 2, wherein the molecular weight ratio of the first and second polymeric block components A and B ranges from about 20:80 to 40:60 or from about 60:40 to about 80:20, wherein the repeating structural units in the periodic patterns comprise an ordered array of cylinders composed of one of the first and second polymeric block components A and B in a matrix composed of the other of the first and second polymeric block components A and B, and wherein said array of cylinders is either parallel or perpendicular to a bottom surface of the trench.

16. The method of claim 15, wherein the trench has preferential sidewall surfaces and a preferential bottom surface, and wherein the array of cylinders is parallel to the preferential bottom surface.

17. The method of claim 15, wherein the trench has preferential sidewall surfaces and a non-preferential bottom surface, and wherein the array of cylinders is perpendicular to the non-preferential bottom surface.

18. The method of claim 2, wherein the molecular weight ratio of the first and second polymeric block components A and B is either less than about 20:80 or greater than about 80:20, and wherein the repeating structural units in the periodic patterns comprise an ordered array of spheres composed of one of the first and second polymeric block components A and B in a matrix composed of the other of the first and second polymeric block components A and B.

19. The method of claim 1, wherein the trench has preferential sidewall surfaces and a preferential bottom surface.

* * * * *